(12) United States Patent
Williams et al.

(10) Patent No.: US 7,392,583 B2
(45) Date of Patent: Jul. 1, 2008

(54) SECURING SOLID-MATRIX PANELS FOR CUTTING USING A TOOLING FIXTURE

(76) Inventors: Bob Allen Williams, 11581 W. 44th Ave., Wheat Ridge, CO (US) 80033; Kurt John Hill, 610 S. 9th St., Berthoud, CO (US) 80513; Allen W. Duck, 5473 Tiller Ct., Fort Collins, CO (US) 80528; Carl Raymond Byers, 9552 Sierra Vista Rd., Longmont, CO (US) 80504; Travis Wayne Groves, 1805 Wood Duck Dr., Johnstown, CO (US) 80534; Dion Joe Casto, 5906 Gregory La., Parker, TX (US) 75002

( * ) Notice: Subject to any disclaimer, the term of this patent is extended or adjusted under 35 U.S.C. 154(b) by 381 days.

(21) Appl. No.: 10/985,772

(22) Filed: Nov. 10, 2004

(65) Prior Publication Data

US 2005/0122128 A1 Jun. 9, 2005

Related U.S. Application Data

(60) Provisional application No. 60/518,732, filed on Nov. 10, 2003, provisional application No. 60/518,850, filed on Nov. 10, 2003.

(51) Int. Cl.
*B23P 19/00* (2006.01)
*B23P 17/00* (2006.01)

(52) U.S. Cl. ............... 29/762; 29/33 P; 29/415; 29/721; 29/742; 29/830; 29/835; 83/292.1

(58) Field of Classification Search .......... 29/33 P, 29/411, 412, 415, 417, 721, 743, 825, 832, 29/846, 762; 83/35, 255, 422–424, 929.1; 438/33, 113, 460; 409/131, 132

See application file for complete search history.

(56) References Cited

U.S. PATENT DOCUMENTS

| | | | |
|---|---|---|---|
| 4,683,789 A | | 8/1987 | Lopez |
| 4,742,615 A | | 5/1988 | Lopez |
| 5,117,554 A | | 6/1992 | Grabow |
| 5,438,740 A | | 8/1995 | Carr et al. |
| 5,839,337 A | * | 11/1998 | Neu .............................. 83/35 |
| 5,894,648 A | | 4/1999 | Hill et al. |
| 6,047,470 A | * | 4/2000 | Drussel et al. ............... 29/847 |
| 6,150,240 A | * | 11/2000 | Lee et al. ................... 438/460 |
| 6,508,154 B1 | * | 1/2003 | Tripard ...................... 83/467.1 |
| 6,671,940 B2 | * | 1/2004 | Ishii ......................... 29/33 M |

* cited by examiner

*Primary Examiner*—Donghai D. Nguyen

(57) ABSTRACT

Tooling fixtures and methods are described for securing a solid-matrix panel for cutting. In one embodiment, a tooling fixture includes a first clamping system and a second clamping system. The first clamping system receives a solid-matrix panel of PCBs and secures the solid-matrix panel for cutting of the solid-matrix panel along a first axis. Once secured, a cutting apparatus cuts the solid-matrix panel along the first axis between the PCBs to cut the solid-matrix panel into a plurality of strips. The second clamping system then moves into a position relative to the strips of the solid-matrix panel and secures the strips for cutting of the strips along a second axis. When secured by the second clamping system, the cutting apparatus cuts the individual PCBs from the strips.

26 Claims, 21 Drawing Sheets

SECURING SOLID-MATRIX PANELS FOR CUTTING USING A TOOLING FIXTURE

RELATED APPLICATIONS

This non-provisional application claims priority to U.S. provisional application No. 60/518,732, which was filed on Nov. 10, 2003, and U.S. provisional application No. 60/518,850, which was filed on Nov. 10, 2003.

BACKGROUND OF THE INVENTION

1. Field of the Invention

The invention is related to the field of depaneling systems, and in particular, to tooling fixtures and methods of using a tooling fixture for securing solid-matrix panels for cutting.

2. Statement of the Problem

There are a variety of machines used to cut Printed Circuit Boards (PCB) out of stock panel. Some stock panels have PCBs that are already populated with components, and other PCBs are unpopulated. Some machines on the market have a saw with a blade or router bit that is fixed in the machine and faces upward. The machines also have movable tooling positioned above the saw. To cut the PCBs out of a panel, the panel is clamped into a tooling fixture. The tooling fixture then moves the panel over the saw to cut the PCBs from the panel.

Other machines have a movable saw that is positioned above the tooling instead of below the tooling. To cut the PCBs out of a panel, the panel is clamped into or set onto a tooling fixture. The tooling fixture then moves into place underneath the saw. The saw moves over the panel to cut the PCBs from the panel. Some examples of depaneling systems are illustrated in U.S. Pat. No. 5,894,648, U.S. Pat. No. 5,438,740, U.S. Pat. No. 5,117,554, U.S. Pat. No. 4,683,789, and U.S. Pat. No. 4,742,615, which are all incorporated by reference to the same extent as if fully included herein.

A stock panel may have different configurations for cutting. One type of stock panel has multiple PCBs that are spaced out on the panel. There are unused portions of stock panel between the PCBs. To facilitate routing of the PCBs from the stock panel, the unused portions of stock panel between the PCBs may be pre-routed. The unused portions of stock panel between the PCBs are partially cut leaving tabs holding the PCBs in place.

When the PCBs are later cut from the stock panel, the depaneling system cuts the remaining tabs and discards the waste (the stock panel remaining after cutting the PCBs). One problem with this type of stock panel is that the area of the stock panel is not fully utilized, as the unused portions of stock panel are needed between the PCBs. Also, the waste left over after cutting has to be discarded by the depaneling system.

Another type of stock panel is a solid-matrix panel. In a solid-matrix panel, the PCBs are adjacent to one another on the panel with no space or unused portions between the PCBs. Solid-matrix panels more efficiently use the area of the stock panel by eliminating the unused portions of stock panel between the PCBs. Unfortunately, solid-matrix panels are more difficult to cut. One way to cut the solid-matrix panels is to V-score the panel along the edges of the PCBs. The PCBs can then be broken out of the panel by hand.

Automated cutting of a solid-matrix panel to remove the PCBs is more difficult. The solid-matrix panel is registered a first time by clamping the solid-matrix panel onto a tooling fixture. A router or saw then makes cuts on the solid-matrix panel along a first axis. The cutting along the first axis cuts the solid-matrix panel into strips. The strips are then registered a second time by re-clamping each strip onto the same or different tooling fixture. The router or saw then makes cuts along a second axis to cut out the individual PCBs.

Unfortunately, the solid-matrix panel has to be registered on the tooling fixture more than once in order to cut the panel. Multiple registrations can be inefficient to the depaneling process. Also, individual PCBs may need registration holes in order to secure the individual PCBs for cutting. It may be desirable to register a solid-matrix panel on a tooling fixture a single time to allow for automated cutting of the solid-matrix panel.

SUMMARY OF THE SOLUTION

The invention helps solve the above and other problems with a tooling fixture and a method of using a tooling fixture, for which a solid-matrix panel may be registered on the tooling fixture a single time, and the tooling fixture secures the solid-matrix panel for cutting along multiple axes.

In one embodiment of the invention, a tooling fixture includes a first clamping system and a second clamping system. The first clamping system receives a solid-matrix panel of PCBs for registration of the solid-matrix panel on the tooling fixture. The first clamping system secures the solid-matrix panel for cutting of the solid-matrix panel along a first axis. Once secured, a cutting apparatus may cut the solid-matrix panel along the first axis between the PCBs to cut the solid-matrix panel into a plurality of strips of PCBs.

The second clamping system then moves into a position relative to the strips of the solid-matrix panel. For instance, after the cutting along the first axis, the first clamping system may spread the strips of the solid-matrix panel along a second axis perpendicular to the first axis so that the second clamping system can move into the proper position. With the strips spread, comb sections of the second clamping system may move along a third axis between the strips of the solid-matrix panel. The second clamping system then secures the strips for cutting of the strips along a second axis. For instance, the second clamping system may compress the strips of the solid-matrix panel onto the comb sections to secure the strips. When secured by the second clamping system, the cutting apparatus may cut the strips of the solid-matrix panel along the second axis. The cutting along the second axis cuts the individual PCBs out of the solid-matrix panel. After cutting is complete, the first clamping system and the second clamping system open to allow the PCBs of the solid-matrix panel to be removed.

The tooling fixture advantageously increases the efficiency of automated cutting of solid-matrix panels by a depaneling system. After a single registration of the solid-matrix panel, the tooling fixture advantageously allows for cutting of a solid-matrix panel along both the first axis and the second axis to separate the PCBs from the solid-matrix panel. The single registration reduces cutting time and avoids loss of positional accuracy that can happen when re-registering a panel.

DESCRIPTION OF THE DRAWINGS

The same reference number represents the same element on all drawings.

DETAILED DESCRIPTION OF THE INVENTION

FIGS. 1-21 and the following description depict specific embodiments of the invention to teach those skilled in the art how to make and use the best mode of the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1:
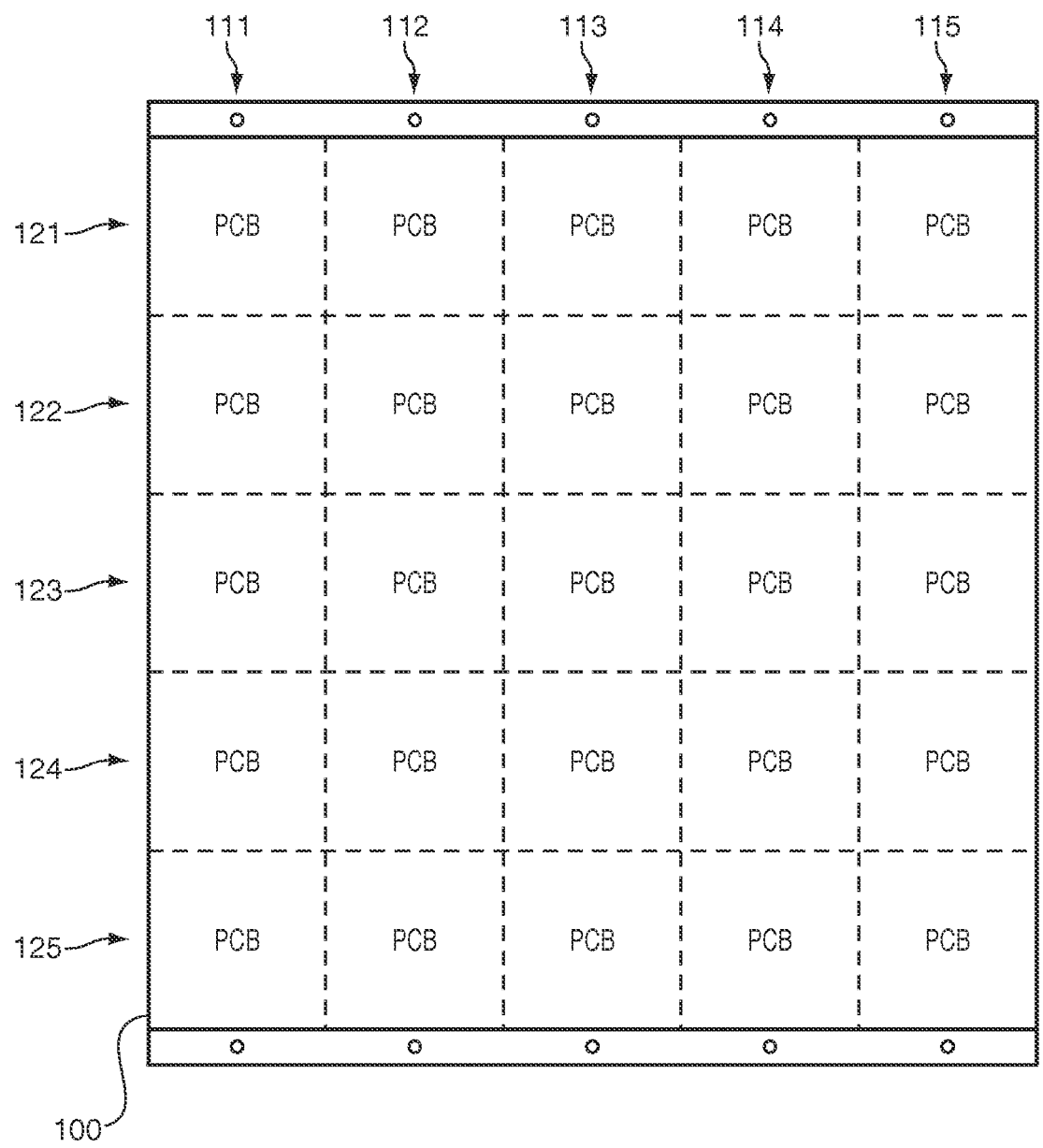
FIG. 1 illustrates a solid-matrix panel.

Solid-Matrix Panel—FIG. 1

FIG. 1 illustrates a solid-matrix panel 100. Solid-matrix panel 100 includes a plurality of Printed Circuit Boards (PCB). Solid-matrix panel 100 is a 5×5 matrix of PCBs in this embodiment, but may comprise other matrix configurations in other embodiments. Solid-matrix panel 100 is comprised of five columns of PCBs 111-115 and five rows of PCBs 121-125. The PCBs on solid-matrix panel 100 may be populated with components or unpopulated.

Solid-matrix panel 100 includes a small unused portion at opposing ends in this embodiment. The unused portions include registration holes for registering panel 100. Solid-matrix panel 100 is just one example of a stock panel and the tooling fixtures described herein are intended to be used with any type of solid-matrix panel.

Figure 2:
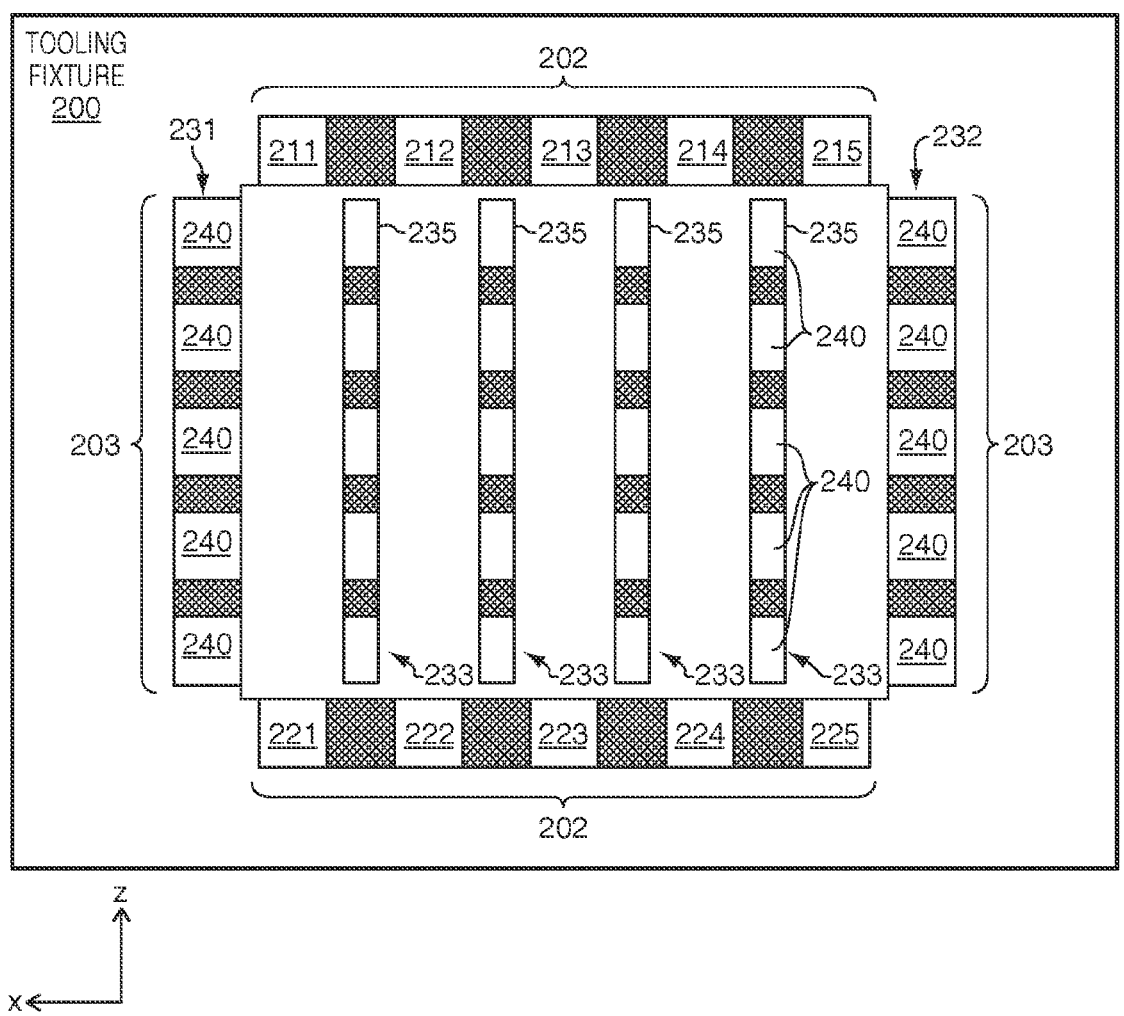
FIG. 2 is a top view of a tooling fixture of a depaneling system in a first exemplary embodiment of the invention.
Figure 3:
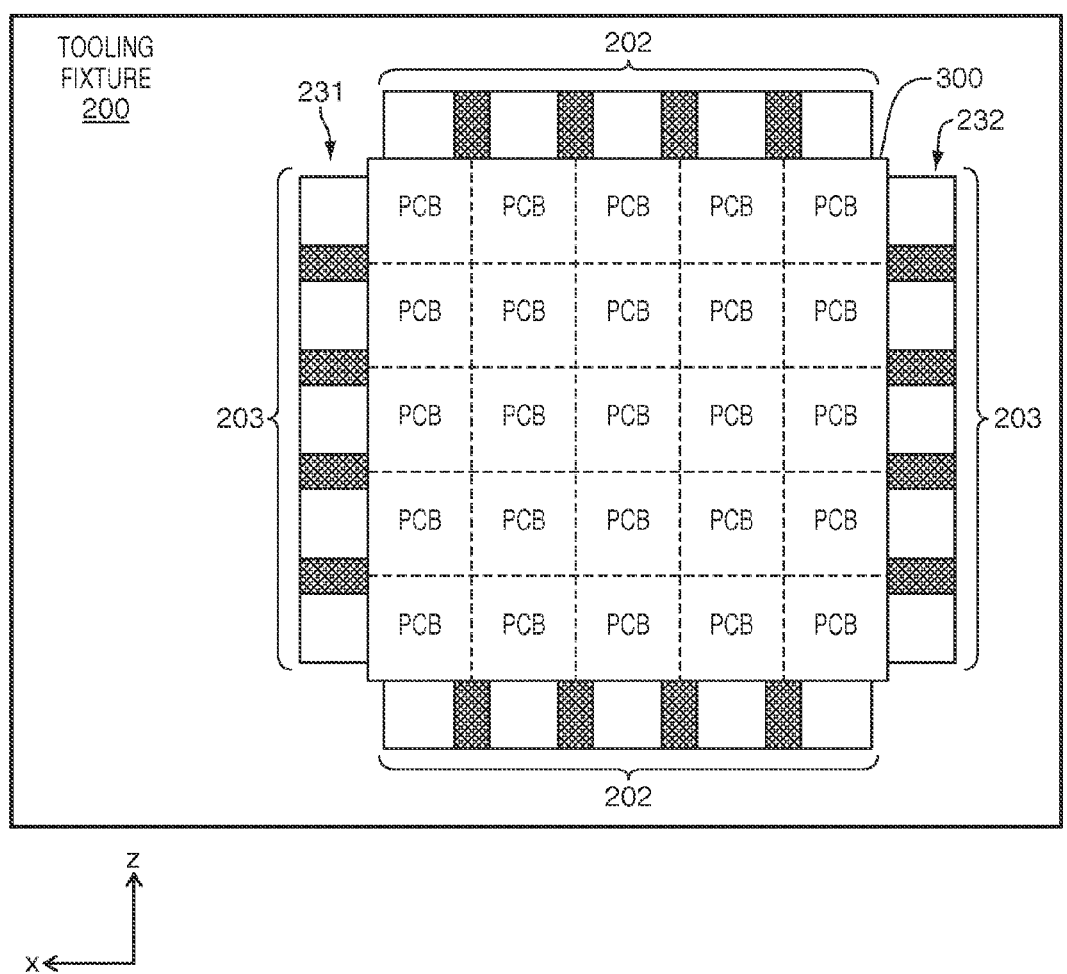
FIG. 3 is a top view of the tooling fixture with a solid-matrix panel registered in an exemplary embodiment of the invention.
Figure 4:
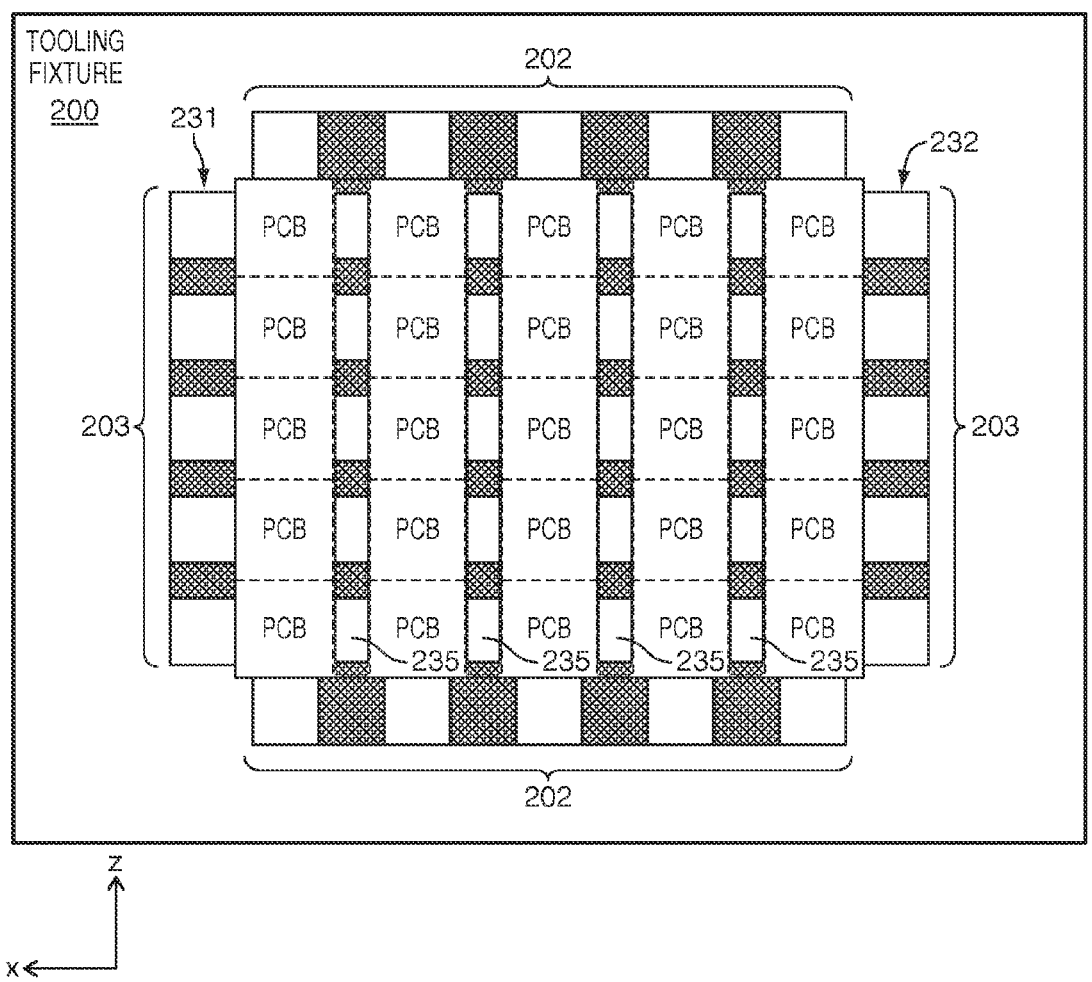
FIG. 4 is a top view of the tooling fixture with a second clamping system moved into position in an exemplary embodiment of the invention.

Tooling Fixture—FIGS. 2-4

FIG. 2 is a top view of a tooling fixture 200 of a depaneling system (not shown) in a first exemplary embodiment of the invention. Tooling fixture 200 includes a first clamping system 202 and a second clamping system 203. First clamping system 202 comprises any system configured to secure, hold, or otherwise clamp a solid-matrix panel for cutting of the solid-matrix panel along a first axis. In one embodiment, first clamping system 202 may include a first plurality of clamps 211-215 and a second plurality of clamps 221-225. The first plurality of clamps 211-215 and the second plurality of clamps 221-225 are configured to secure opposing ends of a solid-matrix panel. Each clamp in the first plurality of clamps 211-215 corresponds with a clamp in the second plurality of clamps 221-225 to form clamp pairs. For instance, clamp 211 corresponds with clamp 221 to form a first clamp pair, clamp 212 corresponds with clamp 222 to form a second clamp pair, etc. Each pair of clamps corresponds with a column of PCBs on a solid-matrix panel and is configured to secure opposing ends of the column of PCBs. Although ten clamps are shown in FIG. 2, first clamping system 202 may include any desired number of clamps.

Second clamping system 203 comprises any system configured to secure, hold, or otherwise clamp strips of a solid-matrix panel for cutting of the strips along a second axis. In one embodiment, second clamping system 203 may include a first end block 231, a second end block 232, and a comb apparatus 233. Comb apparatus 233 includes a plurality of comb sections 235. Although four comb sections 235 are shown in FIG. 2, comb apparatus 233 may include any desired number of comb sections 235. First end block 231, second end block 232, and each comb section 235 includes a plurality of raised members 240. One or more of the raised members 240 of first end block 231, second end block 232, and comb sections 235 correspond with a row of PCBs on a solid-matrix panel.

When in operation on a depaneling system, first clamping system 202 receives a solid-matrix panel of PCBs for registration of the solid-matrix panel on tooling fixture 200. To receive the solid-matrix panel, first clamping system 202 opens to receive the panel. To "open" depends on the configuration of first clamping system 202. For instance, if first clamping system 202 includes a plurality of clamps, then to "open" means that the clamps open to receive an end of the panel. If first clamping system 202 includes one or more moveable end blocks, then to "open" means that one or both end blocks move along the Z-axis so that there is room between the end blocks to receive the panel.

FIG. 3 is a top view of tooling fixture 200 with a solid-matrix panel 300 registered in an exemplary embodiment of the invention. First clamping system 202 secures solid-matrix panel 300 for cutting of solid-matrix panel 300 along a first axis (illustrated as the Z-axis in FIG. 3). To secure solid-matrix panel 300, first clamping system 202 closes onto solid-matrix panel 300. To "close" depends on the configuration of first clamping system 202. For instance, if first clamping system 202 includes a plurality of clamps, then to "close" means that the clamps secure upon an end of the panel 300. If first clamping system 202 includes one or more moveable end blocks, then to "close" means that one or both end blocks move along the Z-axis toward one another to secure panel 300. In some embodiments, second clamping system 203 secures solid-matrix panel 300 in addition to first clamping system 202 for cutting along the first axis.

When secured by first clamping system 202, a cutting apparatus (not shown) of the depaneling system cuts solid-matrix panel 300 along the first axis. The cutting apparatus cuts solid-matrix panel 300 on the vertical dotted lines between the PCBs. The cutting along the first axis cuts solid-matrix panel 300 into a plurality of strips of PCBs.

With solid-matrix panel 300 cut into strips, second clamping system 203 moves into a position relative to the strips of solid-matrix panel 300 and secures the strips for cutting of the strips along a second axis (illustrated as the X-axis in FIG. 4) that is perpendicular to the first axis. First clamping system 202 may also secure solid-matrix panel 300 for cutting along the second axis.

FIG. 4 is a top view of tooling fixture 200 with second clamping system 203 moved into position in an exemplary embodiment of the invention. In one embodiment, after the cutting along the first axis, first clamping system 202 spreads the strips of solid-matrix panel 300 along the second axis so that second clamping system 203 can move into the proper position. With the strips spread, comb sections 235 of second clamping system 203 move along a third axis into the position relative to the strips of solid-matrix panel 300. The third axis is perpendicular to both the first axis and the second axis, and would be coming out of FIG. 4. In moving along the third axis in FIG. 4, comb sections 235 raise up between the strips. Second clamping system 203 then compress the strips of solid-matrix panel 300 onto comb sections 235 to secure the strips for the cutting along the second axis.

When secured by second clamping system 203, the cutting apparatus of the depaneling system cuts the strips of solid-matrix panel 300 along the second axis. The cutting apparatus cuts the strips on the horizontal dotted lines between the PCBs. The cutting along the second axis cuts the individual PCBs out of solid-matrix panel 300. After cutting is complete, first clamping system 202 and second clamping system 203 open to allow the PCBs of solid-matrix panel 300 to be removed.

Tooling fixture 200 increases the efficiency of automated cutting of solid-matrix panels by a depaneling system. After a single registration of the solid-matrix panel, tooling fixture 200 advantageously allows for cutting of a solid-matrix panel along both the first axis and the second axis to separate the PCBs from the panel. The single registration reduces cutting time and avoids loss of positional accuracy that can happen when re-registering a panel.

Another Tooling Fixture—FIGS. 5-16

Figure 5:
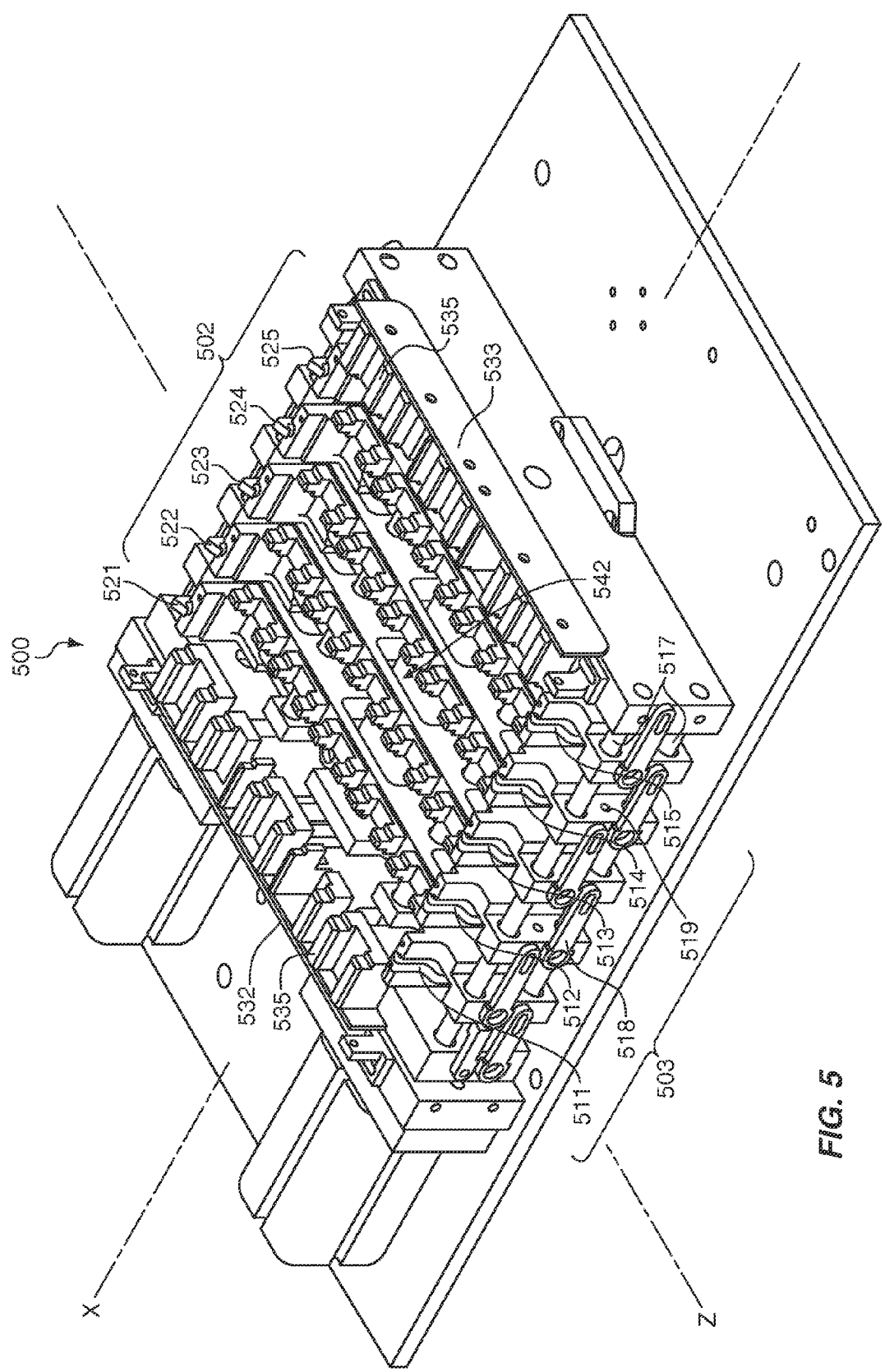
FIG. 5 is an isometric view of a tooling fixture for a depaneling system in a second exemplary embodiment of the invention.

FIG. 5 is an isometric view of a tooling fixture 500 for a depaneling system (not shown) in a second exemplary embodiment of the invention. Tooling fixture 500 includes clamping system 502 and clamping system 503 opposing one another. Clamping system 503 includes a plurality of clamps 511-515 configured to secure ends of a solid-matrix panel, such as solid-matrix panel 100 shown in FIG. 1. Clamps 511-515 are each connected to guide shafts 517. Clamps 511-515 can slide along the X-axis on guide shafts 517. Successive clamps 511-515 are connected to one another by link plates 518. Link plates 518 are slotted to control the maximum distance between successive clamps 511-515 when the clamps 511-515 move apart from one another along the X-axis. One or more of clamps 511-515 have a stop bolt (not shown) that controls the minimum distance between successive clamps when the clamps move toward one another along the X-axis. Although the stop bolts are not shown in FIG. 5, the hole 519 for a stop bolt is shown in clamp 514.

Clamps 511-515 each comprise a registration pin and a hook apparatus. One example of clamps 511-515 is shown in FIGS. 17-21. The registration pin is fixed and the hook apparatus is movable. When a solid-matrix panel is set on tooling fixture 500, the hook apparatus moves toward the registration pin to secure the solid-matrix panel between the hook apparatus and the registration pin. Clamps 511-515 are pneumatic clamps in this embodiment.

Clamping system 502 substantially resembles clamping system 503. Clamping system 502 includes a plurality of clamps 521-525. Each clamp 511-515 of clamping system 503 corresponds with a clamp 521-525 of clamping system 502. For instance, clamp 511 corresponds with clamp 521, clamp 512 corresponds with clamp 522, etc. Corresponding clamps from clamping systems 502-503 comprise clamping pairs for securing opposing ends of a solid-matrix panel. For instance, clamp 511 and clamp 521 comprise a pair of clamps configured to secure opposing ends of a solid-matrix panel. Each pair of clamps corresponds with a column of PCBs of a solid-matrix panel when a panel is registered on tooling fixture 500.

Tooling fixture 500 also includes end blocks 532 and 533 opposing one another. In this embodiment, end block 532 is movable along the X-axis. In other embodiments, end block 533 may be movable along the X-axis in addition to end block 532 or instead of end block 532. Each end block 532 and 533 includes a plurality of raised members 535. One or more of the raised members 535 corresponds with a row of PCBs of a solid-matrix panel when the panel is registered on tooling fixture 500.

Figure 6:
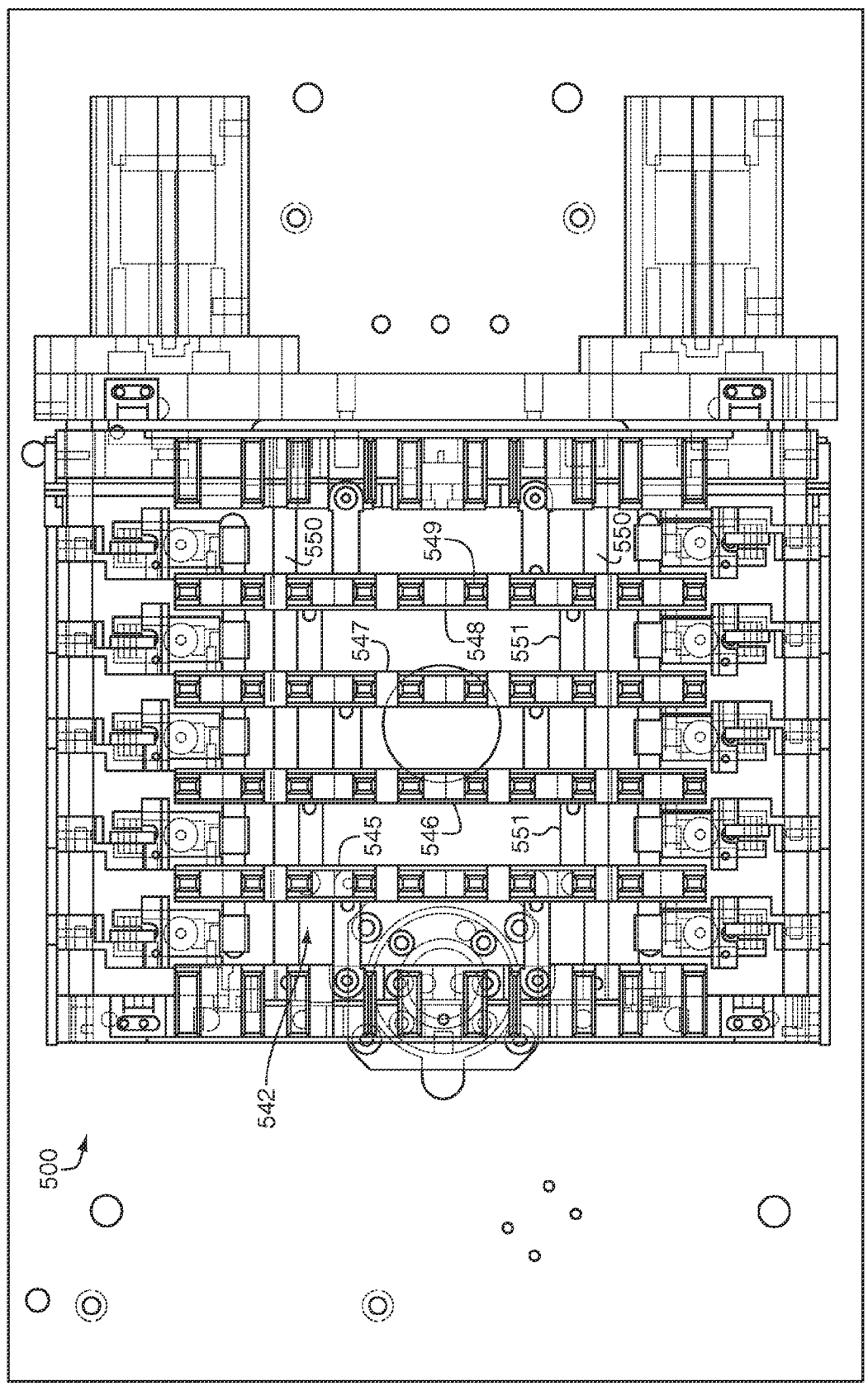
FIG. 6 is a top view of the tooling fixture in an exemplary embodiment of the invention.

Tooling fixture 500 also includes a comb apparatus 542. FIG. 6 is a top view of tooling fixture 500 in an exemplary embodiment of the invention. Comb apparatus 542 includes a plurality of comb sections 545-548. Each comb section 545-548 includes a plurality of raised members 549. One or more of the raised members 549 corresponds with a row of PCBs of a solid-matrix panel when the panel is registered on tooling fixture 500. Comb sections 545-548 are each connected to guide shafts 550. Comb sections 545-548 can slide along the X-axis on guide shafts 550. Successive comb sections 545-548 are connected to one another by link plates 551. Link plates 551 are slotted to control the maximum distance between successive comb sections 545-548 when the comb sections 545-548 move apart from one another along the X-axis. Comb sections 545-548 can also move up and down along the Y-axis.

Figure 7:
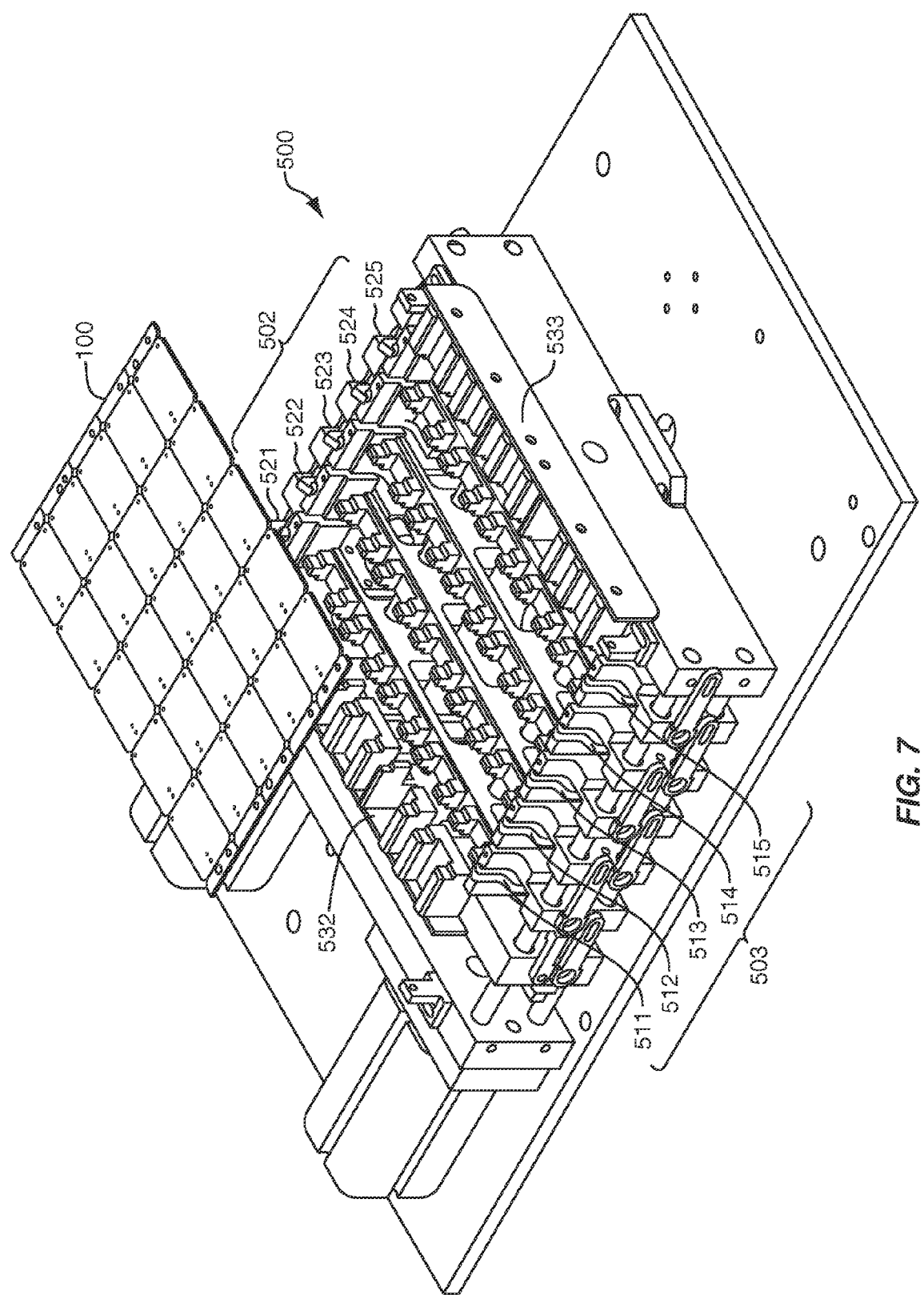
FIG. 7 is an isometric view of the tooling fixture with a solid-matrix panel about to be registered in an exemplary embodiment of the invention.
Figure 8:
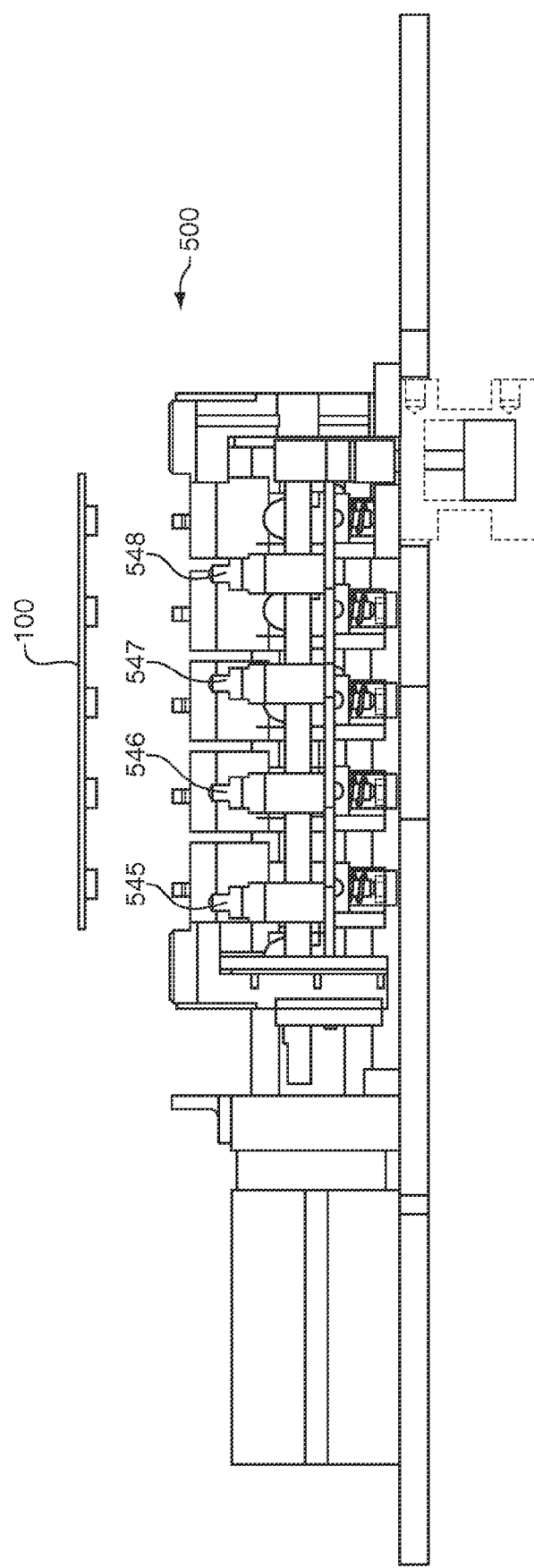
FIG. 8 is a side view of the tooling fixture with the solid-matrix panel about to be registered in an exemplary embodiment of the invention.

FIG. 7 is an isometric view of tooling fixture 500 with a solid-matrix panel 100 about to be registered in an exemplary embodiment of the invention. Tooling fixture 500 is in an initial position for receiving solid-matrix panel 100 for registration. To receive solid-matrix panel 100, the clamps 511-515 and 521-525 of clamping systems 502-503 are open so that they may receive solid-matrix panel 100. The comb sections 545-548 are also lowered along the Y-axis to not interfere with the solid-matrix panel 100. End block 532 may slide along the X-axis away from end block 533 so that there is room between end block 532 and end block 533 to receive solid-matrix panel 100. FIG. 8 is a side view of tooling fixture 500 with solid-matrix panel 100 about to be registered in an exemplary embodiment of the invention. FIG. 8 illustrates comb sections 545-548 lowered out of the way so that solid-matrix panel 100 can be registered on tooling fixture 500.

Figure 9:
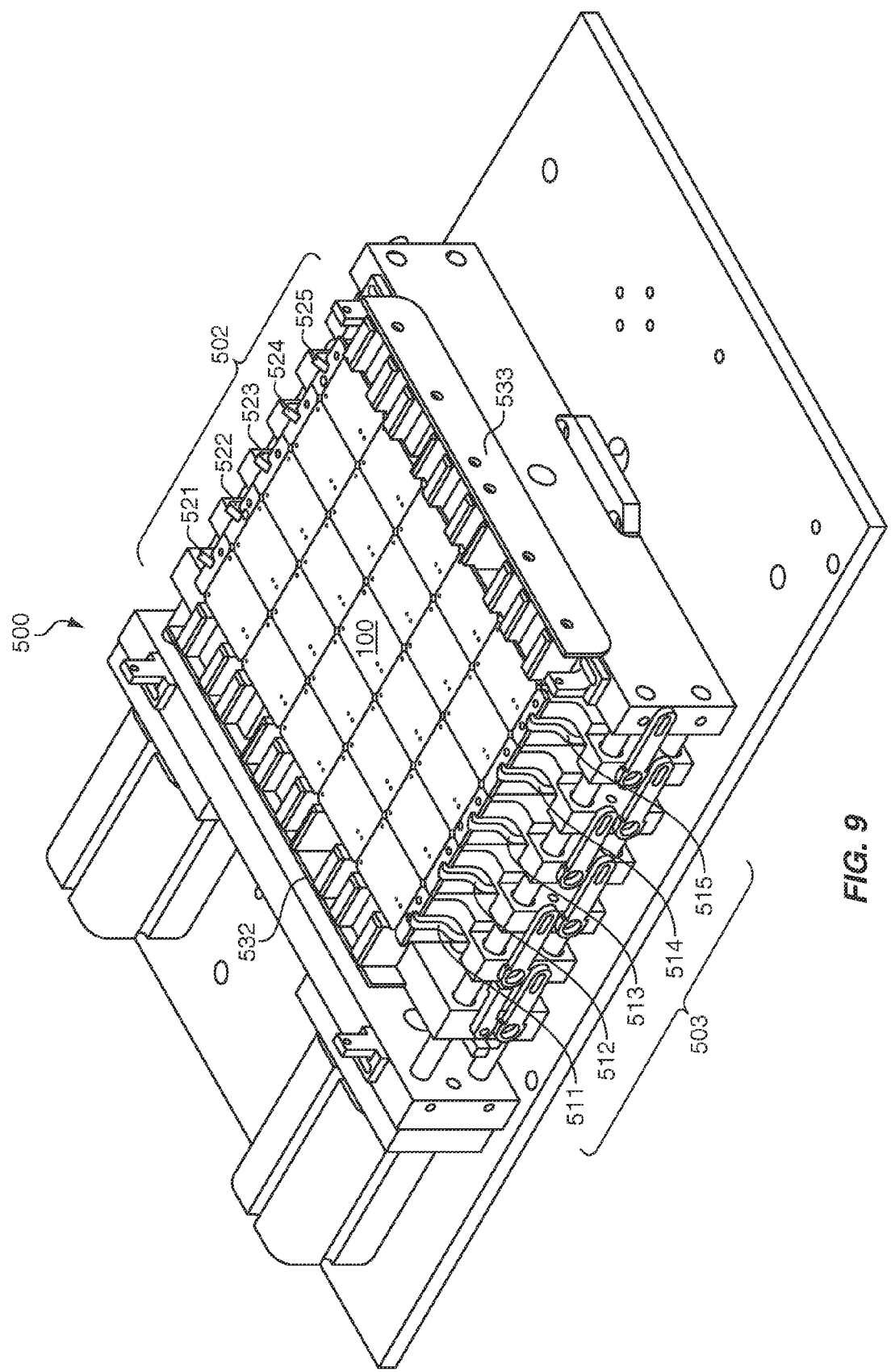
FIG. 9 is an isometric view of the tooling fixture with the solid-matrix panel registered in an exemplary embodiment of the invention.

FIG. 9 is an isometric view of tooling fixture 500 with solid-matrix panel 100 registered in an exemplary embodiment of the invention. With solid-matrix panel 100 registered, tooling fixture 500 closes on solid-matrix panel 100 to secure solid-matrix panel 100 for cutting. The clamps 511-515 and 521-525 of clamping systems 502-503 close on solid-matrix panel 100 to secure panel 100 in place. End block 532 may also slide along the X-axis toward end block 533 to compress solid-matrix panel 100 between end block 532 and end block 533.

Figure 10:
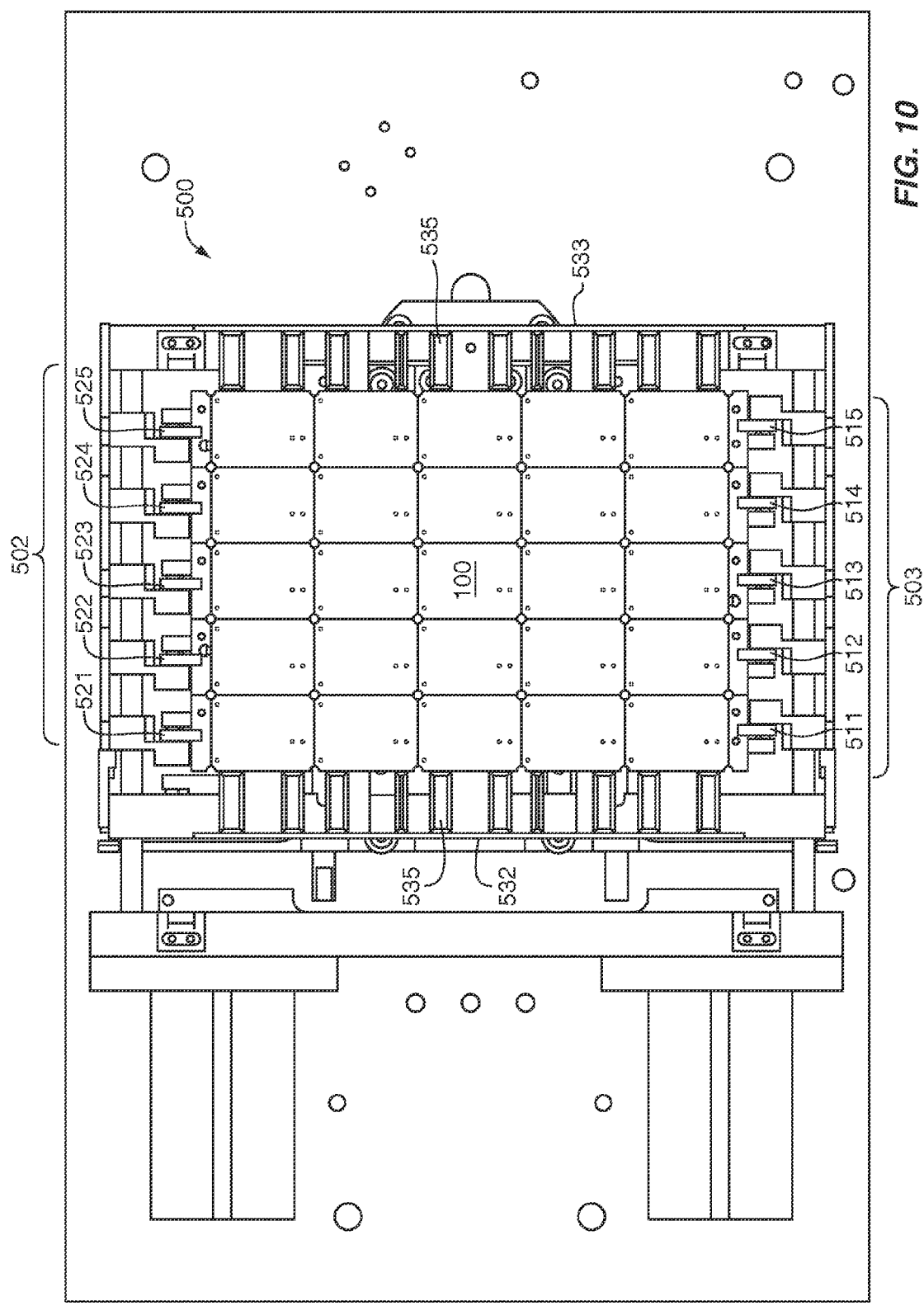
FIG. 10 is a top view of the tooling fixture with the solid-matrix panel registered in an exemplary embodiment of the invention.

FIG. 10 is a top view of tooling fixture 500 with solid-matrix panel 100 registered in an exemplary embodiment of the invention. With solid-matrix panel 100 registered on tooling fixture 500, FIG. 10 shows that clamps 511-515 and 521-525 of clamping systems 502-503 correspond with columns of solid-matrix panel 100. Although one clamp of each clamping system 502-503 corresponds with a column of solid-matrix panel 100 in this embodiment, multiple clamps may correspond with a column in other embodiments. FIG. 10 also shows that raised members 535 of end blocks 532-533 correspond with rows of solid-matrix panel 100.

Referring to FIG. 9, with solid-matrix panel 100 secured in place by tooling fixture 500, a cutting apparatus (not shown) may cut solid-matrix panel 100 along the Z-axis. The cutting apparatus cuts between the PCBs of solid-matrix panel to cut the panel 100 into a plurality of strips. For solid-matrix panel 100, there would be four cuts along the Z-axis leaving five strips. The cutting device may be a router, saw, laser, etc.

Figure 11:
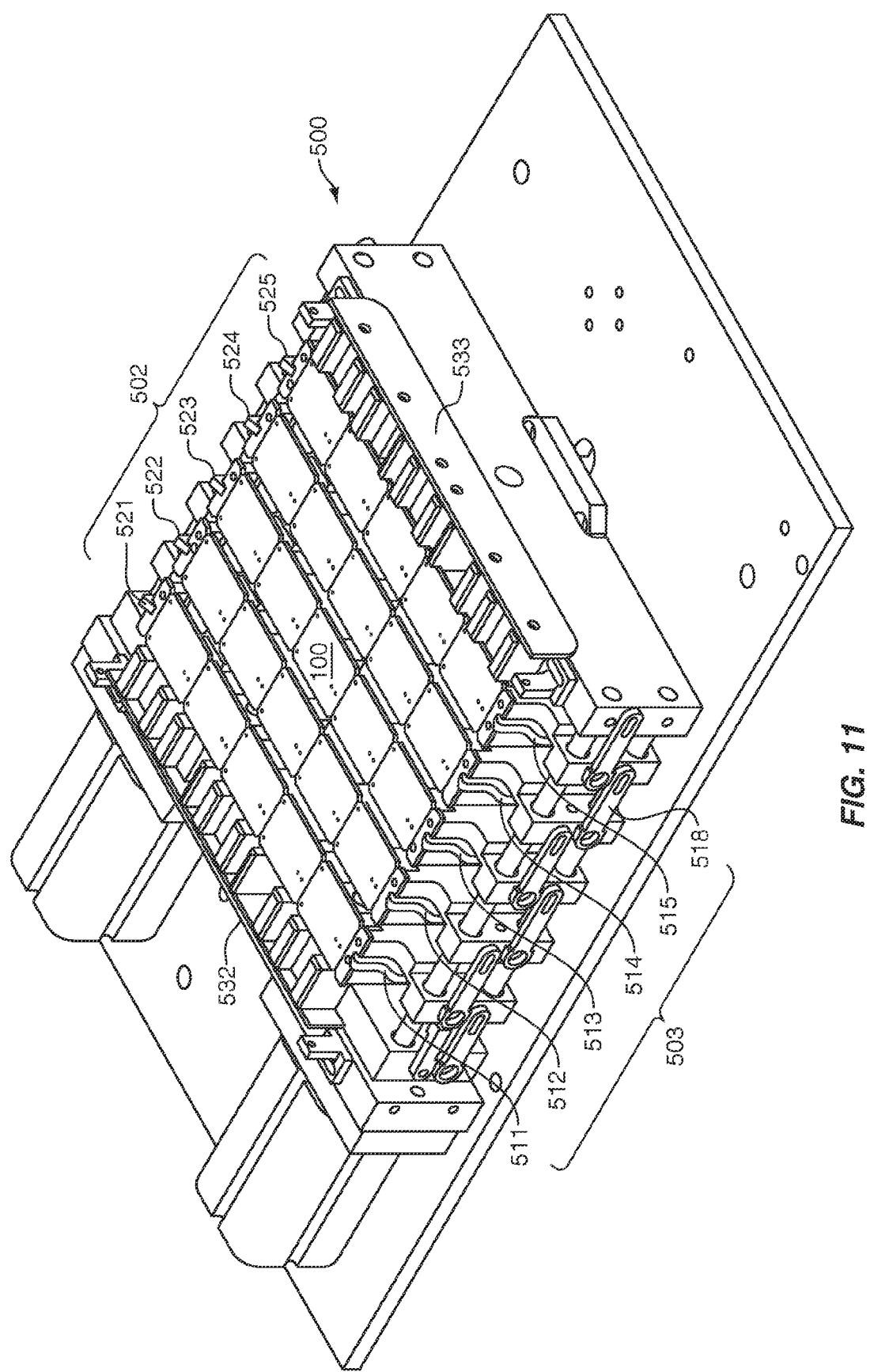
FIG. 11 is an isometric view of the tooling fixture spread to separate the strips of the solid-matrix panel in an exemplary embodiment of the invention.
Figure 12:
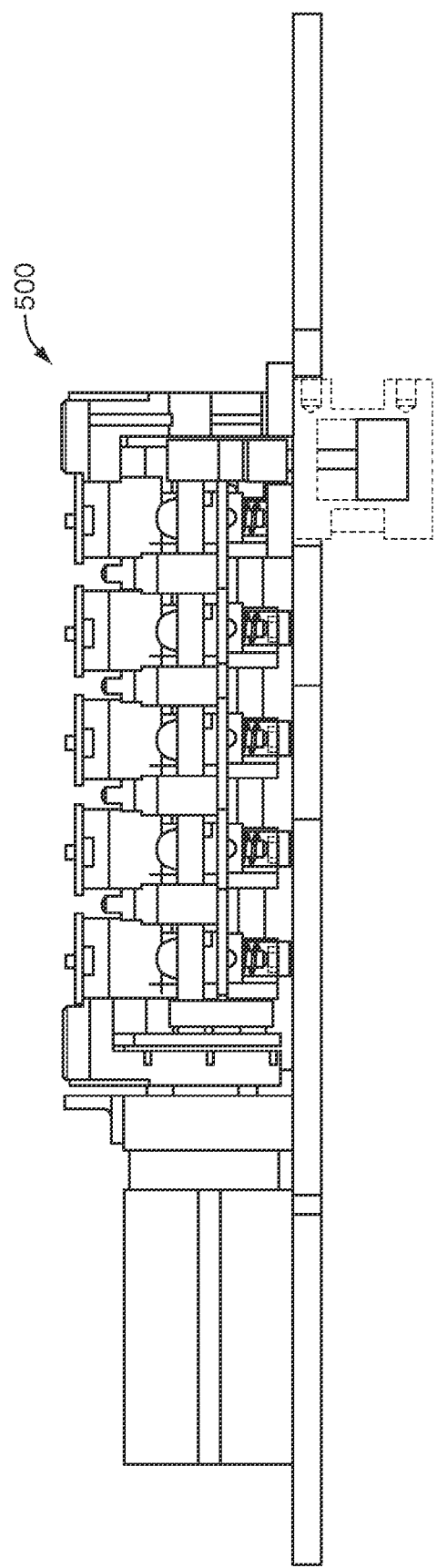
FIG. 12 is a side view of the tooling fixture spread in an exemplary embodiment of the invention.

With solid-matrix panel 100 cut into strips, tooling fixture 500 spreads the strips of solid-matrix panel 100. FIG. 11 is an isometric view of tooling fixture 500 spread to separate the strips of solid-matrix panel 100 in an exemplary embodiment of the invention. To spread tooling fixture 500, end block 532 and clamps 511-515 and 521-525 slide along the X-axis to spread the strips of solid-matrix panel 100. Stop bolts or some other apparatus may control the maximum distance that end block 532 moves along the X-axis. Link plates 518 control the maximum distance between successive clamps 511-515 and 521-525. FIG. 12 is a side view of tooling fixture 500 spread in an exemplary embodiment of the invention.

Figure 13:
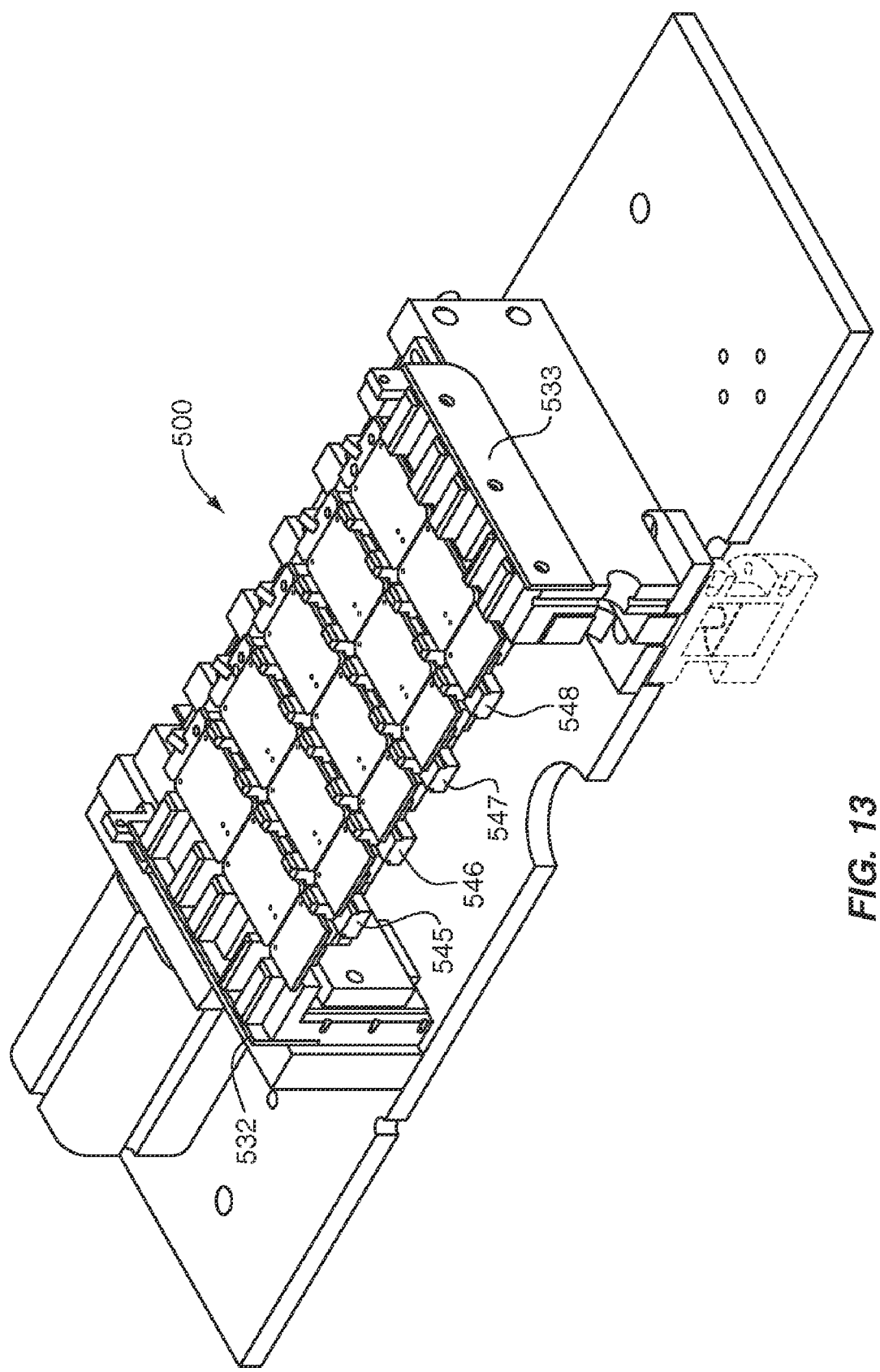
FIG. 13 is an isometric view of the tooling fixture with comb sections raised between the strips in an exemplary embodiment of the invention.
Figure 14:
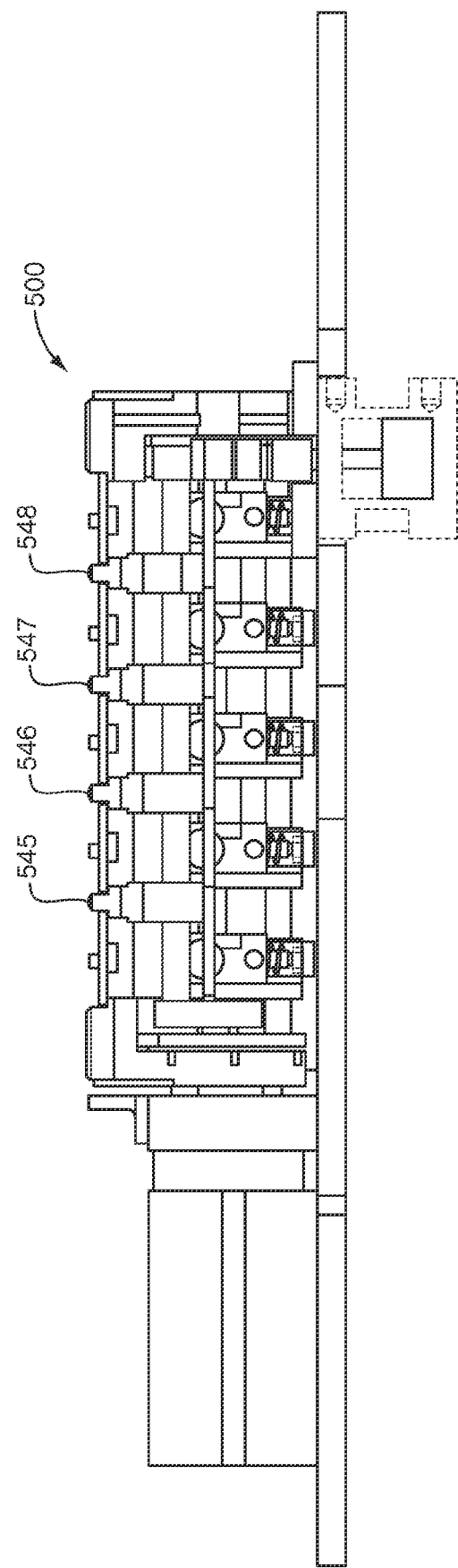
FIGS. 14-15 are side views and top views respectively of the comb sections in a raised position between the strips in an exemplary embodiment of the invention.
Figure 15:
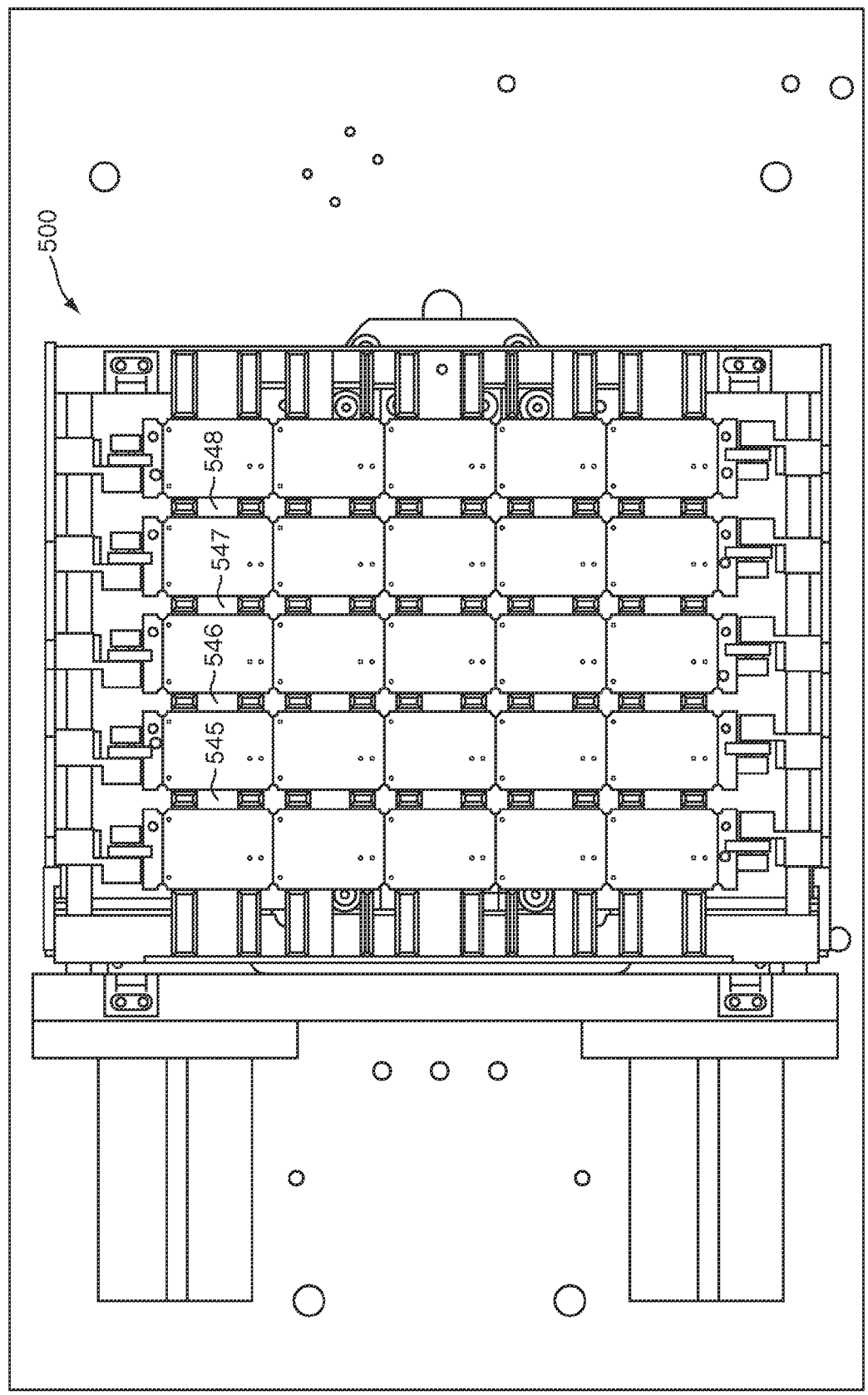

With tooling fixture 500 spread open, comb sections 545-548 raise along the Y-axis between the strips. FIG. 13 is an isometric view of tooling fixture 500 with comb sections 545-548 raised between the strips in an exemplary embodiment of the invention. Tooling fixture 500 then closes again with the comb sections 545-548 raised between the strips. To close, end block 532 moves toward end block 533 along the X-axis to compress the strips between end blocks 532-533 and comb sections 545-548. Each strip is secured on all sides. FIGS. 14-15 are side views and top views respectively of comb sections 545-548 in a raised position between the strips in an exemplary embodiment of the invention.

Figure 16:
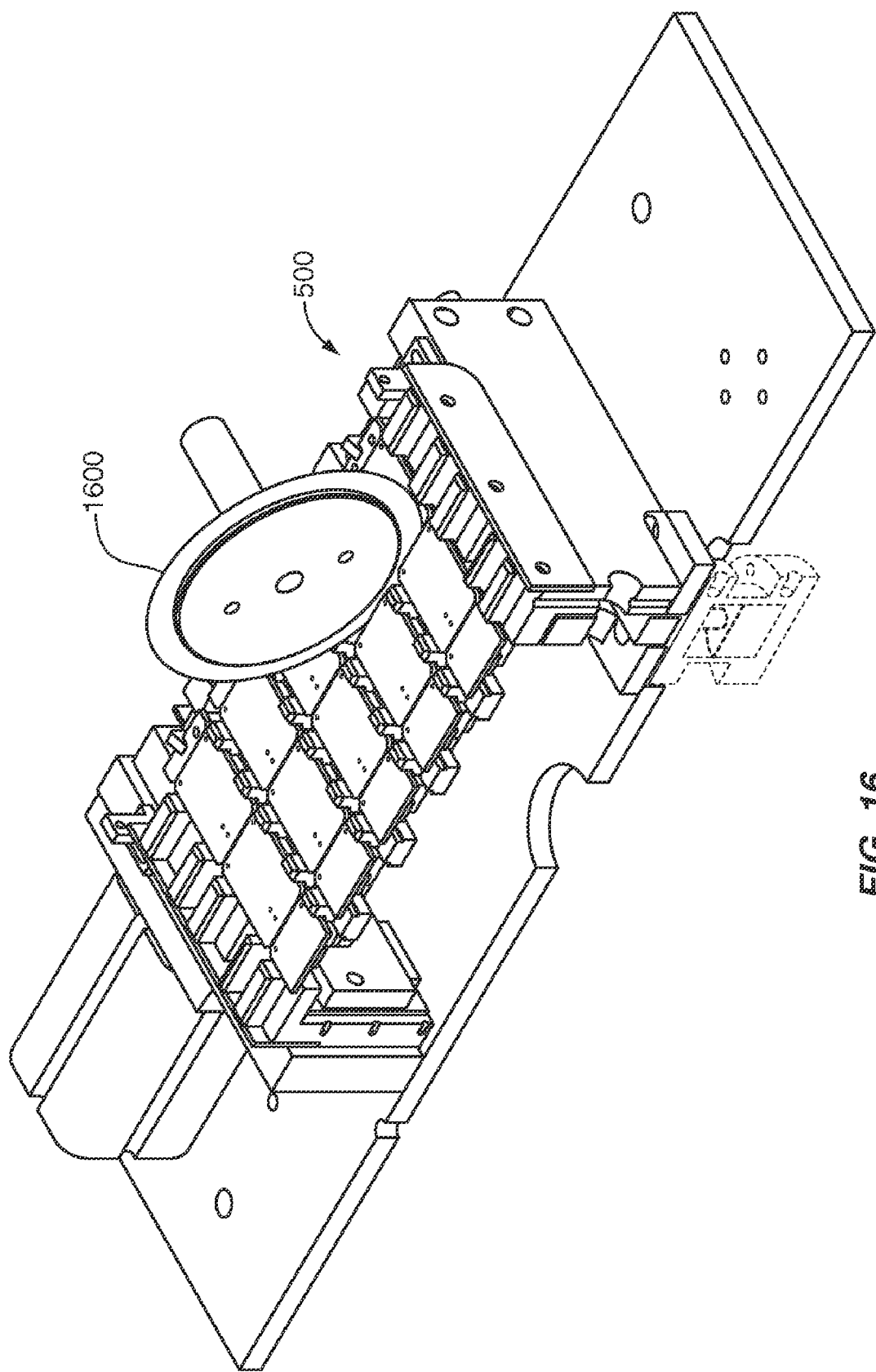
FIG. 16 is an isometric view of the tooling fixture clamping the strips during cutting in an exemplary embodiment of the invention.

FIG. 16 is an isometric view of tooling fixture 500 clamping the strips during cutting in an exemplary embodiment of the invention. With the strips secured by tooling fixture 500, a cutting apparatus 1600 may cut the strips along the X-axis. Cutting apparatus 1600 cuts between the PCBs to cut the strips into individual PCBs.

After cutting is completed, tooling fixture 500 opens to allow the PCBs of solid-matrix panel 100 to be removed. The PCBs may be moved to an unload station by hand, using a robotic arm, or some other means.

Clamp—17-21

Figure 17:
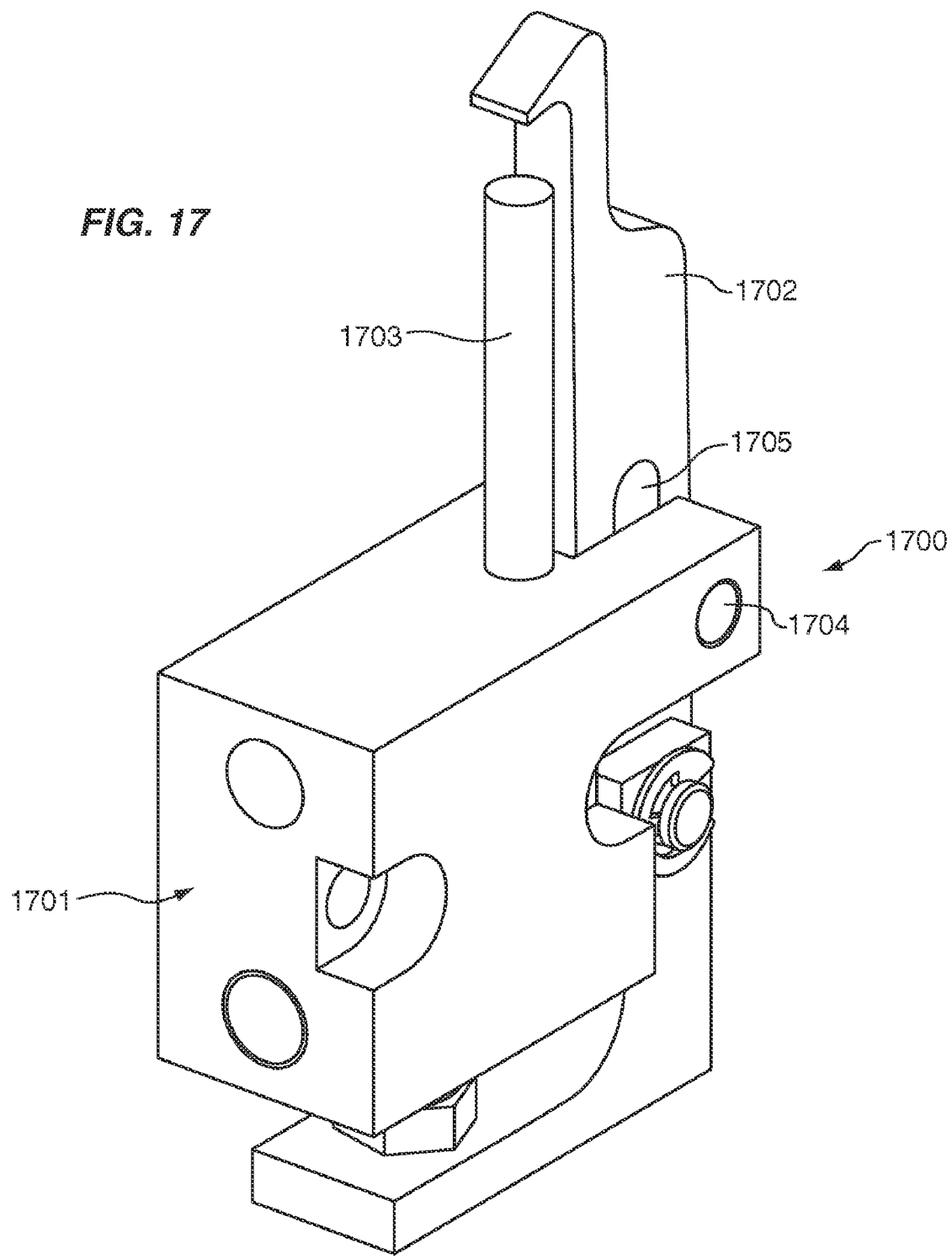
FIGS. 17-21 illustrate a clamp in an exemplary embodiment of the invention.
Figure 18:
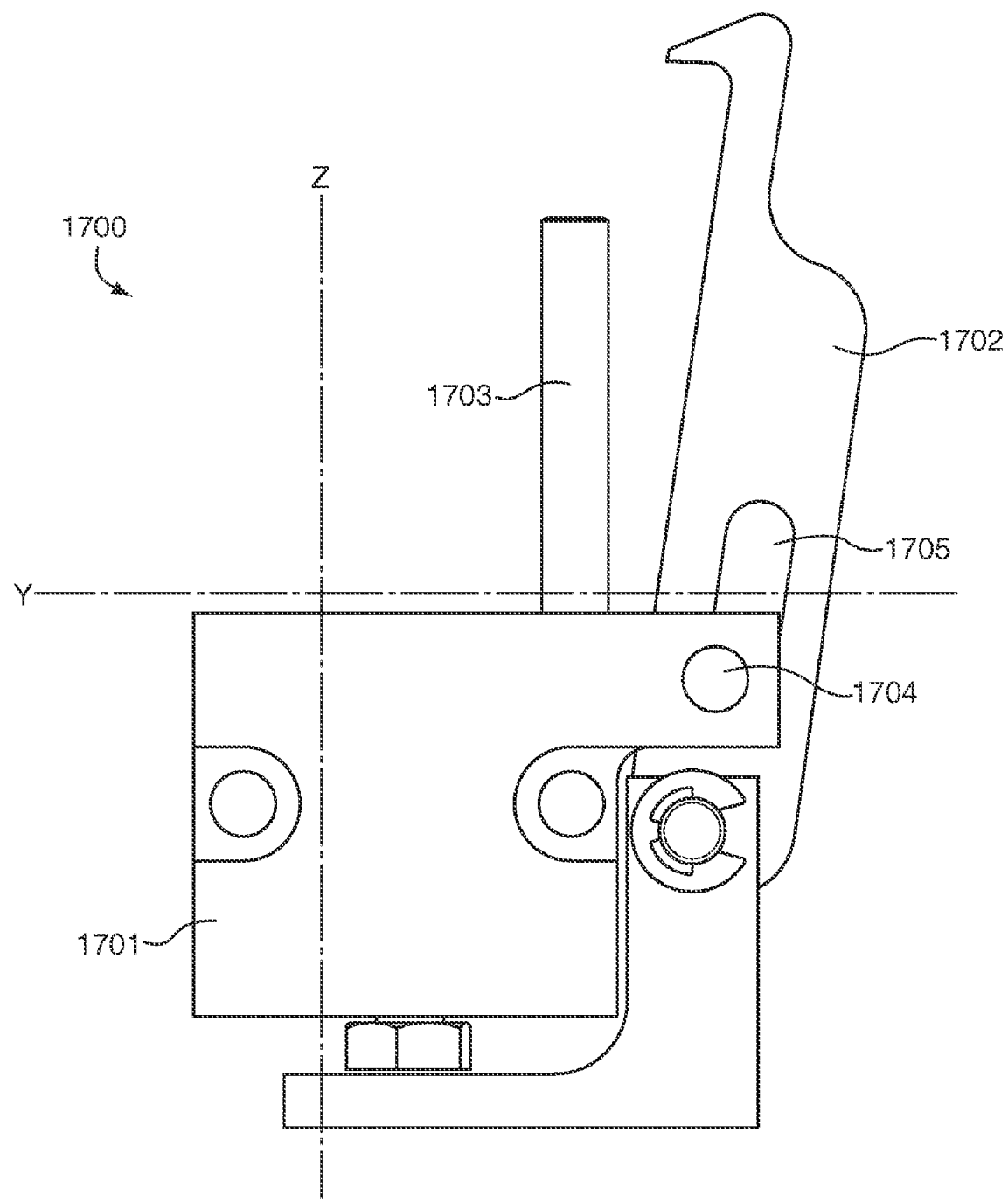
Figure 19:
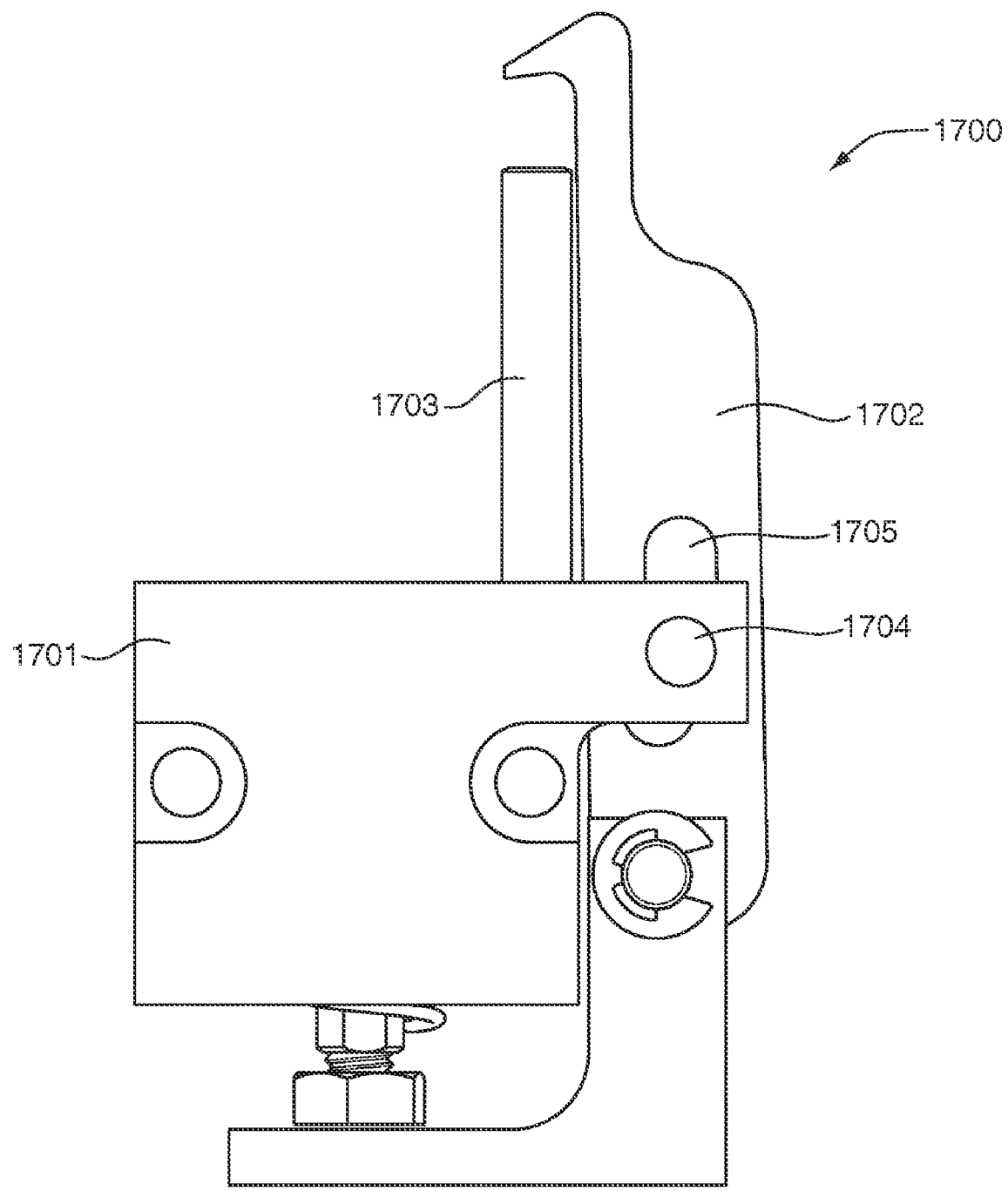
Figure 20:
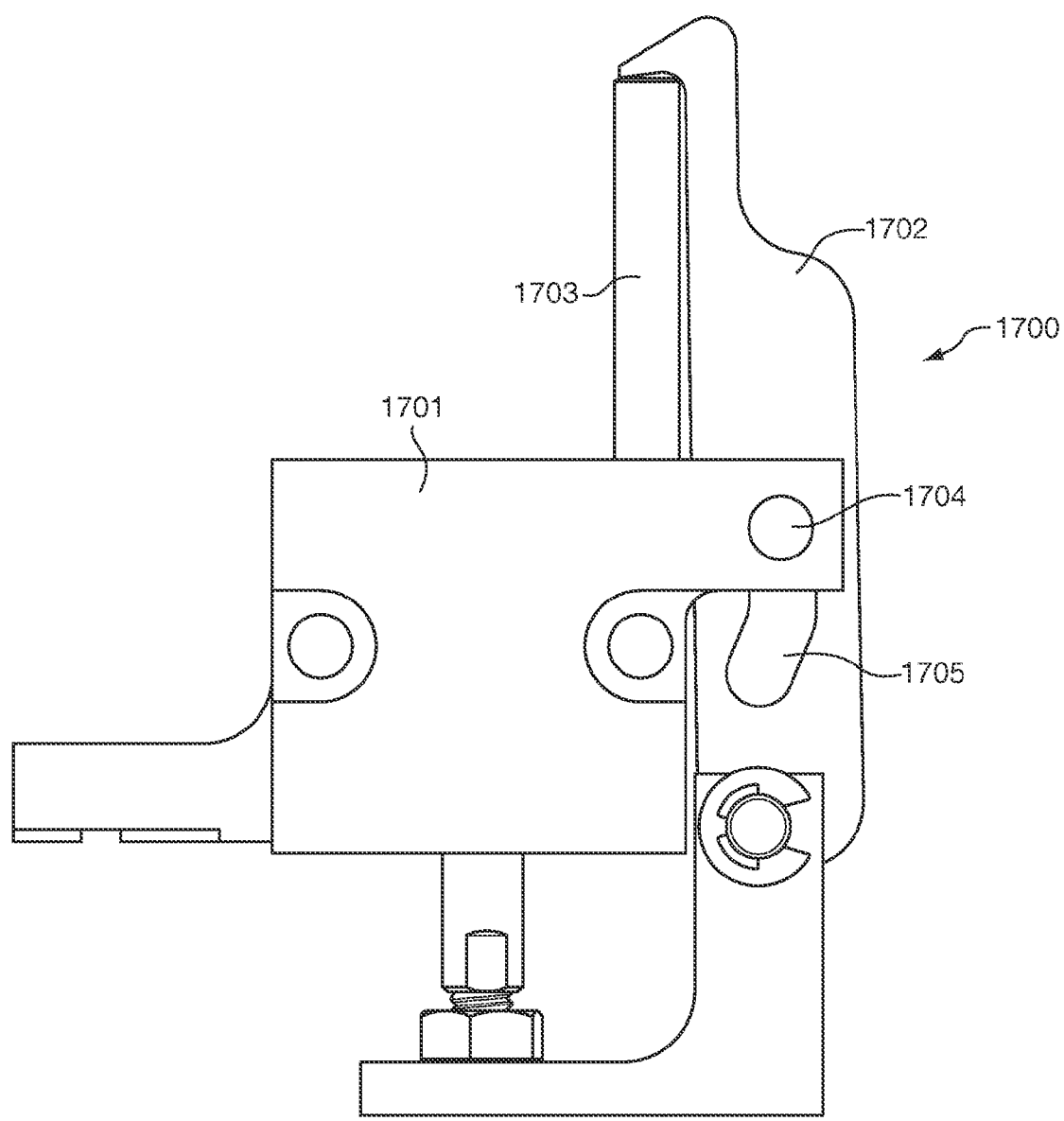
Figure 21:
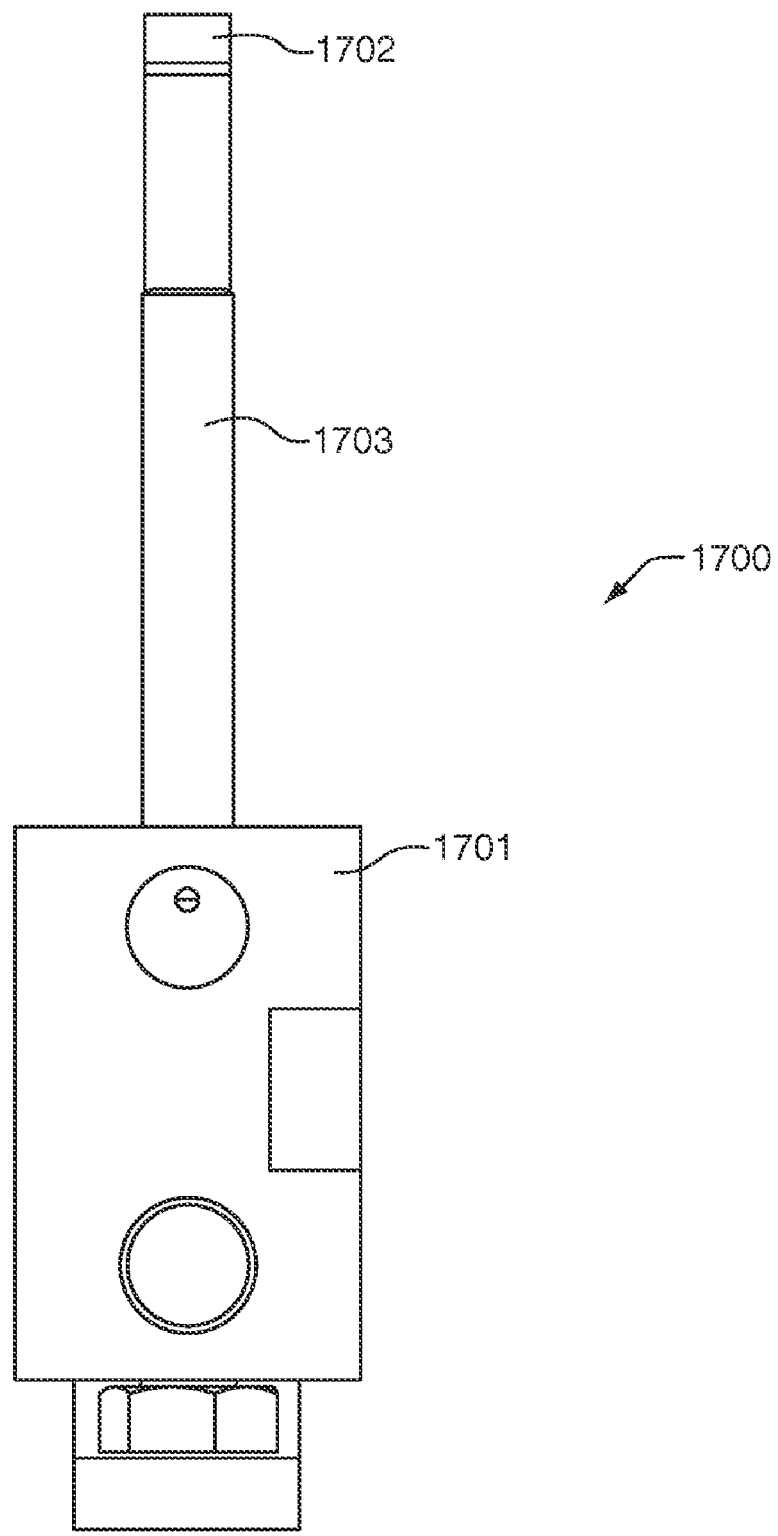

FIG. 17 shows an isometric view of a clamp 1700 in an exemplary embodiment of the invention. Clamp 1700 includes a main body 1701, a moveable securing member 1702, and a registration pin 1703. Main body 1701 includes a pin 1704 that is configured to pass through a slot 1705 in securing member 1702 to couple securing member 1702 to main body 1701. Clamp 1700 is configured to secure a panel for cutting between securing member 1702 and registration pin 1703. FIG. 18 shows a side view of clamp 1700 in an exemplary embodiment of the invention. In FIG. 18, securing member 1702 is open. Securing member 1702 is configured to move along a Y-axis and a Z-axis. With securing member 1702 in this position, clamp 1700 is ready to receive a panel. Securing member 1702 may be spring loaded to move securing member 1702 in this position. FIG. 19 shows a side view of clamp 1700 in an exemplary embodiment of the invention. In FIG. 19, securing member 1702 has moved along the Y-axis toward registration pin 1703. Slot 1705 in securing member 1702 controls the movement of securing member 1702 upon pin 1704. Securing member 1702 may be moved with a cylinder, such as an air cylinder. FIG. 20 shows a side view of clamp 1700 in an exemplary embodiment of the invention. In FIG. 20, securing member 1702 has moved along the Z-axis toward the top of registration pin 1703. In this position, securing member 1702 is able to clamp a panel between securing member 1402 and the top of registration pin 1703. Registration pin 1703 may include a point to help secure the panel. To remove the panel, securing member 1702 returns to the position shown in FIG. 18. FIG. 21 shows a front view of clamp 1700 in an exemplary embodiment of the invention.

Advantageously, clamp 1700 provides an apparatus wherein panels can be quickly and easily loaded on and unloaded from a tooling fixture. Securing member 1702 moves out of the way to load a panel, and with the panel loaded, securing member 1702 is moved into a position to secure the panel to registration pin 1703. To unload the panel, securing member 1702 can again be moved out of the way.

What is claimed is:

1. A tooling fixture for a depaneling system, the tooling fixture comprising:
   a first clamping system that receives a solid-matrix panel of Printed Circuit Boards (PCB) for registration of the solid-matrix panel on the tooling fixture, secures the solid-matrix panel for cutting of the solid-matrix panel along a first axis, wherein the cutting along the first axis cuts the solid-matrix panel into a plurality of strips, and spreads the strips of the solid-matrix panel along a second axis after the cutting along the first axis; and
   a second clamping system that includes a comb apparatus having a plurality of comb sections that move along a third axis into a position between the strips of the solid-matrix panel without re-registration of the strips of the solid-matrix panel on the tooling fixture, and secures the strips of the solid-matrix panel on the comb apparatus for cutting of the strips along the second axis perpendicular to the first axis.

2. The tooling fixture of claim 1 wherein the first clamping system opens to receive the solid-matrix panel.

3. The tooling fixture of claim 1 wherein the first clamping system secures the solid-matrix panel by closing on the solid-matrix panel.

4. The tooling fixture of claim 1 wherein the first clamping system comprises:

a first plurality of clamps and a second plurality of clamps configured to secure opposing ends of the solid-matrix panel.

5. The tooling fixture of claim 4 wherein each clamp in the first plurality of clamps corresponds with a clamp in the second plurality of clamps to form clamp pairs, wherein each pair of clamps corresponds with a column of PCBs on the solid-matrix panel is configured to secure opposing ends of the column of PCBs.

6. The tooling fixture of claim 4 wherein the clamps comprise pneumatic clamps.

7. The tooling fixture of claim 4 wherein each of the clamps comprises:
a registration pin; and
a hook apparatus that moves toward the registration pin to secure the solid-matrix panel between the hook apparatus and the registration pin.

8. The tooling fixture of claim 1 wherein:
the second clamping system compresses the strips of the solid-matrix panel onto the comb sections to secure the strips for the cutting along the second axis.

9. The tooling fixture of claim 1 wherein the second clamping system further includes:
a first end block having a plurality of raised members; and
a second end block having a plurality of raised members;
wherein each of the comb sections includes a plurality of raised members;
wherein at least one of the raised members of the first end block, the second end block, and the comb sections correspond with a row of PCBs on the solid-matrix panel when the panel is registered on the tooling fixture.

10. The tooling fixture of claim 8 wherein:
the first clamping system and the second clamping system open to allow the individual PCBs of the solid-matrix panel to be removed after cutting along the second axis.

11. A method of securing a solid-matrix panel of Printed Circuit Boards (PCB) on a tooling fixture for cutting by a depaneling system, the method comprising the steps of:
registering the solid-matrix panel onto the tooling fixture;
securing the solid-matrix panel with a first clamping system of the tooling fixture for cutting along a first axis, wherein the cutting along the first axis separates the solid-matrix panel into a plurality of strips of the solid-matrix panel;
spreading the strips of the solid-matrix panel along a second axis;
moving a second clamping system into a position relative to the strips of the solid-matrix panel without re-registration of the strips of the solid-matrix panel on the tooling fixture;
moving comb sections of the second clamping system along a third axis into a position between the strips of the solid-matrix panel; and
securing the strips of the solid-matrix panel with the second clamping system and the comb sections for cutting along the second axis perpendicular to the first axis.

12. The method of claim 11 wherein the step of registering the solid-matrix panel on the tooling fixture comprises:
opening the first clamping system to receive the solid-matrix panel.

13. The method of claim 12 wherein the step of securing the solid-matrix panel with the first clamping system comprises:
closing the first clamping system on the solid-matrix panel.

14. The method of claim 11 wherein the step of securing the strips of the solid-matrix panel with the second clamping system and the comb sections for cutting along a second axis comprises:
compressing the strips of the solid-matrix panel onto the comb sections to secure the strips for the cutting along the second axis.

15. The method of claim 14 further comprising the step of:
opening the first clamping system and the second clamping system to allow the individual PCBs of the solid-matrix panel to be removed.

16. A tooling fixture for a depaneling system, the tooling fixture comprising:
a first plurality of clamps and a second plurality of clamps that receive a solid-matrix panel of Printed Circuit Boards (PCB) for registration of the solid-matrix panel on the tooling fixture, wherein the first plurality of clamps and the second plurality of clamps secure two opposite ends of the solid-matrix panel; and
a first end block, a second end block, and a comb apparatus, wherein the first end block and the second end block also receive the solid-matrix panel and secure the other two ends of the solid-matrix panel;
the first plurality of clamps, the second plurality of clamps, the first end block, and the second end block secure the solid-matrix panel for cutting of the solid-matrix panel along a first axis, wherein the cutting along the first axis cuts the solid-matrix panel into a plurality of strips;
after cutting along the first axis, the first plurality of clamps, the second plurality of clamps, and at least one of the first end block and the second end block spread the strips of the solid-matrix panel along a second axis perpendicular to the first axis;
the comb apparatus moves comb sections between the strips of the solid-matrix panel;
the first end block, the second end block, and the comb sections of the comb apparatus compress the strips of the solid-matrix panel along the second axis for cutting of the strips along the second axis.

17. The tooling fixture of claim 16 wherein each clamp in the first plurality of clamps corresponds with a clamp in the second plurality of clamps to form clamp pairs, wherein each pair of clamps corresponds with a column of PCBs on the solid-matrix panel and is configured to secure opposing ends of the column of PCBs.

18. The tooling fixture of claim 17 wherein each of the clamps comprises:
a registration pin; and
a hook apparatus that moves toward the registration pinto secure the solid-matrix panel between the hook apparatus and the registration pin.

19. The tooling fixture of claim 17 wherein the clamps comprise pneumatic clamps.

20. The tooling fixture of claim 16 wherein:
the first end block includes a plurality of raised members;
the second end block includes a plurality of raised members;
the comb sections of the comb apparatus each include a plurality of raised members; and
at least one of the raised members of the first end block, the second end block, and the comb sections correspond with a row of PCBs on the solid-matrix panel when the panel is registered on the tooling fixture.

21. The tooling fixture of claim 16 wherein the comb apparatus comprises:
   a guide shaft connecting the comb sections, wherein the comb sections are moveable on the guide shaft along the second axis to vary the distance between successive comb sections.

22. The tooling fixture of claim 21 wherein the comb apparatus further comprises:
   link plates connecting successive comb sections that limit the maximum distance between the successive comb sections.

23. The tooling fixture of claim 22 wherein the plurality of comb sections are movable along a third axis to slide between the strips of the solid-matrix panel.

24. The tooling fixture of claim 16 further comprising:
   a guide shaft connecting successive clamps of the first plurality of clamps, wherein the successive clamps are moveable on the guide shaft along the second axis to vary the distance between the successive clamps.

25. The tooling fixture of claim 24 further comprising:
   link plates connecting the successive clamps that limit the maximum distance between the successive clamps.

26. The tooling fixture of claim 25 further comprising:
   stop bolts affixed to one or more of the successive clamps that limit the minimum distance between the successive clamps.

* * * * *